(12) United States Patent
Frish

(10) Patent No.: US 9,753,226 B2
(45) Date of Patent: *Sep. 5, 2017

(54) PHOTONICS GRATING COUPLER AND METHOD OF MANUFACTURE

(71) Applicant: Micron Technology, Inc., Boise, ID (US)

(72) Inventor: Harel Frish, Moshav Sede Moshe (IL)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/976,677

(22) Filed: Dec. 21, 2015

(65) Prior Publication Data

US 2016/0109658 A1    Apr. 21, 2016

Related U.S. Application Data

(63) Continuation of application No. 13/829,893, filed on Mar. 14, 2013, now Pat. No. 9,239,432.

(51) Int. Cl.
| | |
|---|---|
| *G02B 6/30* | (2006.01) |
| *B29D 11/00* | (2006.01) |
| *G03F 7/00* | (2006.01) |
| *G02B 5/18* | (2006.01) |
| *C03C 15/00* | (2006.01) |
| *G02B 6/36* | (2006.01) |

(Continued)

(52) U.S. Cl.
CPC .......... *G02B 6/30* (2013.01); *B29D 11/00663* (2013.01); *C03C 3/04* (2013.01); *C03C 15/00* (2013.01); *G02B 5/1857* (2013.01); *G02B 6/124* (2013.01); *G02B 6/13* (2013.01); *G02B 6/132* (2013.01); *G02B 6/34* (2013.01); *G02B 6/3628* (2013.01); *G03F 7/0005* (2013.01); *G02B 6/122* (2013.01); *G02B 2006/12061* (2013.01); *G02B 2006/12092* (2013.01)

(58) Field of Classification Search
CPC . G02B 6/124; G02B 6/13; G02B 6/30; G02B 6/34; G02B 6/3628; G02B 2006/12061; G02B 2006/12092; G02B 5/1857; G02B 6/122; G02B 6/132; B29D 11/00663; G03F 7/0005; C03C 15/00; C03C 3/04
USPC ......... 385/14, 32, 37, 49–52, 129–132, 144; 438/31–32; 430/321; 216/24
See application file for complete search history.

(56) References Cited

U.S. PATENT DOCUMENTS 3,904,272 A * 9/1975 Straka ................... G02F 1/0316
359/254
5,033,812 A    7/1991 Yoshida et al.
(Continued)

OTHER PUBLICATIONS

"Sending Light Where It Is Needed"; Gray-Scale Lithography; Website: http://www.rpcphotonics.com/lithography.asp; pp. 1-2.
(Continued)

*Primary Examiner* — Tina Wong
*Assistant Examiner* — Michael Mooney
(74) *Attorney, Agent, or Firm* — Perkins Coie LLP

(57) ABSTRACT

A structure for coupling an optical signal between an integrated circuit photonic structure and an external optical fiber is disclosed as in a method of formation. The coupling structure is sloped relative to a horizontal surface of the photonic structure such that light entering or leaving the photonic structure is substantially normal to its upper surface.

20 Claims, 5 Drawing Sheets

(51) Int. Cl.
*C03C 3/04* (2006.01)
*G02B 6/132* (2006.01)
*G02B 6/34* (2006.01)
*G02B 6/124* (2006.01)
*G02B 6/13* (2006.01)
*G02B 6/122* (2006.01)
*G02B 6/12* (2006.01)

(56) References Cited

U.S. PATENT DOCUMENTS

| | | | | |
|---|---|---|---|---|
| 5,044,718 | A | * | 9/1991 | Kando .................. G02B 6/34 369/44.32 |
| 5,056,099 | A | * | 10/1991 | Bradley ................ H01S 5/028 359/577 |
| 5,208,882 | A | | 5/1993 | Strasser et al. |
| 7,397,987 | B2 | | 7/2008 | Witzens et al. |
| 7,792,402 | B2 | | 9/2010 | Peng |
| 7,920,770 | B2 | | 4/2011 | Holzwarth et al. |
| 8,280,207 | B2 | | 10/2012 | Pinguet et al. |
| 8,335,414 | B2 | | 12/2012 | Zinoviev et al. |
| 8,649,099 | B2 | * | 2/2014 | Schultz ............ B29D 11/00663 359/630 |
| 2011/0255824 | A1 | | 10/2011 | Lee et al. |
| 2012/0224810 | A1 | | 9/2012 | Doerr |
| 2014/0270642 | A1 | | 9/2014 | Frish |

OTHER PUBLICATIONS

C.M. Waits et al.; "Microfabrication of 3D Silicon MEMS Structures Using Gray-Scale Lithography and Deep Reactive Ion Etching"; Sensors and Actuators A 119; 2005; pp. 245-253.

Christiane Gimkiewicz et al.; "Fabrication of Microprisms for Planar Optical Interconnections by Use of Analog Gray-Scale Lithography With High-Energy-Beam-Sensitive Glass"; Applied Optics; vol. 38; No. 14; May 10, 1999; pp. 2986-2990.

Jiang J. et al., "Embedded Slanted Grating for Vertical Coupling Between Fibers and Silicon-on-Insulator Planar Waveguides", IEEE Photonics Technology Letters, IEEE Service Center, vol. 17, No. 9, Sep. 1, 2005, pp. 1884-1886.

Z.Y. Li et al.; "Refractive Index Buffer Enhanced Out-of-Plane Coupling in Silicon-on-Insulator"; 2009; IEEE; pp. 181-183.

* cited by examiner

PHOTONICS GRATING COUPLER AND METHOD OF MANUFACTURE

CROSS-REFERENCE TO RELATED APPLICATION

This application is a continuation of U.S. application Ser. No. 13/829,893 filed Mar. 14, 2013, which is incorporated herein by reference.

GOVERNMENT RIGHTS

This invention was made with Government support under Agreement 9999404-12-0008 awarded by DARPA. The Government has certain rights in the invention.

FIELD OF THE INVENTION

Embodiments of the invention provide a structure for coupling optical signals between an integrated circuit photonics device, e.g., a waveguide, and an external optical fiber.

BACKGROUND OF THE INVENTION

Optical signal transmission may be used to communicate signals between separated integrated circuit chips to provide inter-chip connections and within components on the same integrated circuit chip to provide inter-chip connections. In many instances, it is necessary to couple an external optical fiber to a photonic device, e.g., a waveguide, of an integrated circuit photonics chip. Such coupling requires precise optical alignment between the optical fiber and the photonic device to maximize optical signal transmission between them.

However, coupling light into and out of a sub-micron integrated photonic device, such as a waveguide, with high efficiency is difficult because of the small waveguide mode size compared with that of an optical fiber.

Such optical coupling is made conventionally through a diffraction grating coupler provided on a planar upper surface of a waveguide which changes the direction of an optical signal passing through the waveguide from being generally parallel to the running length of waveguide to a direction which is out of the waveguide.

FIG. 1 illustrates in cross section an example of a prior art grating coupler. An integrated circuit photonic structure 10 is provided which has a silicon-on-insulator (SOI) substrate having a silicon base 11, a buried oxide (BOX) 13, typically formed of silicon dioxide, formed over silicon base 11, and a silicon fabrication material 26, which is formed into a waveguide core 15. The BOX 13 provides a lower cladding for the silicon waveguide core 15 and a further oxide material 17, which has a flat upper surface 22, is provided as side and an upper cladding for the waveguide core 15. A grating coupler 21 is formed in the upper surface 18 of the waveguide core 15 to direct light passing between the waveguide core 15 and an optical fiber 131. The optical fiber 131 has a core 133 and outer cladding 135.

As shown, light entering into or exiting from the grating coupler 21 in the direction of arrows A is angled along optical axis B relative to the upper surface 22 of upper cladding 17. This angling of light along axis B is an inherent characteristic of grating coupler 21. Depending on the design of the grating coupler 21, including materials used, the optical axis B is at an angle in the range of about 8 to about 12 degrees from a direction normal to the upper surface 22 of photonic structure 10. As a result, if an optical fiber 131 is arranged to be normal to the upper surface of the photonic structure there is a considerable optical signal power loss, as much as 50%, between the grating coupler 21 and optical fiber 131. Thus, to obtain maximum efficiency in the transfer of light between the grating coupler 21 and optical fiber 131, the optical fiber 131 must, as shown, also be angled by a like amount relative to the upper surface 22 of the photonic structure 10. This complicates packaging of the photonic structure 10 as a mechanical angled coupling must be provided for the optical fiber 131. Moreover, the connection between the angled optical fiber 131 and photonic structure 10 typically requires an active alignment system to ensure alignment of the optical fiber 131 to the photonic structure 10 along optical axis B. This adds costs and complexity to the packaging of the photonic structure 10.

What is needed is a grating coupler and method of formation which provides an optical signal which is emitted to or received by an optical grating coupler in a direction substantially normal to the upper surface 22 of the photonic structure 10 to facilitate mechanical coupling with an optical fiber 131.

DETAILED DESCRIPTION OF THE INVENTION

Embodiments described herein provide a grating coupler for an integrated photonic structure, and a method of its formation, which achieves a light coupling into and out of the photonic structure in a direction which is substantially normal to an upper surface of the photonic structure. In the context of this application substantially normal encompasses normal and a deviation of no more than 2 degrees from normal. As a result, assembly of the integrated circuit with an external light fiber can be facilitated, without requiring an active alignment structure between the two.

Figure 1:
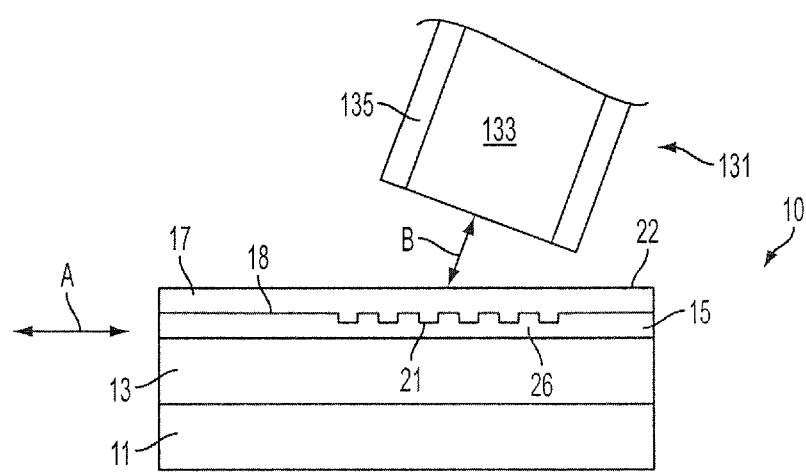
FIG. 1 illustrates in cross-section a prior art arrangement of a photonic structure with an optical fiber.
Figure 2:
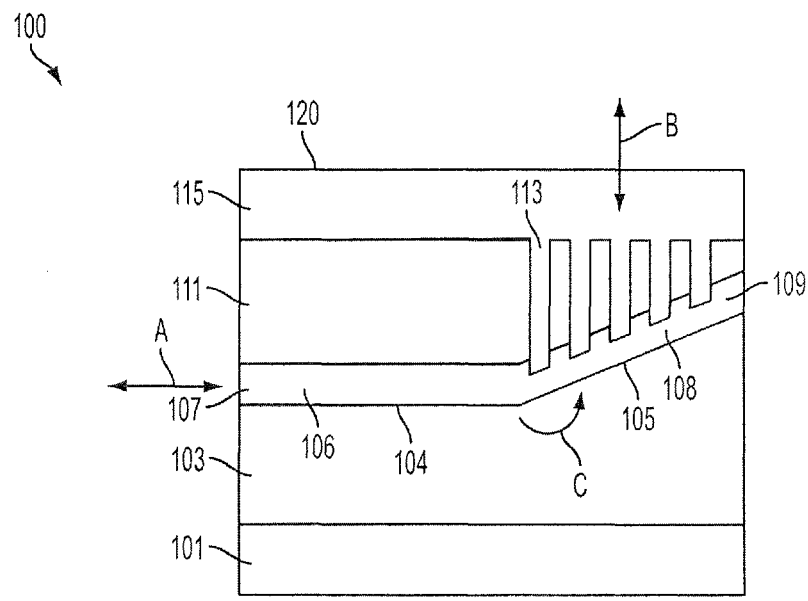
FIG. 2 illustrates in a cross-section an embodiment of the invention.

FIG. 2 illustrates in cross-section one embodiment of an integrated photonic structure 100 which has an optical axis B between a grating coupler 109 and an external fiber (FIG. 4) in a direction substantially normal to an upper surface 120 of the photonic structure 100. It comprises a substrate 101, for example a silicon substrate, and a lower cladding material 103 of an oxide, for example, silicon dioxide. The lower cladding material 103 is provided with a generally horizontal portion having a horizontal upper surface 104 and an upwardly sloping portion having an upwardly sloping upper surface 105. The photonic structure 100 further comprises a waveguide core 107 formed of, for example, silicon provided over the lower cladding material 103. The waveguide core 107 has a horizontal portion 106 and an upwardly sloping portion 108. The silicon used for waveguide core 107 can be polycrystalline silicon, single crystal silicon or amorphous silicon. The slope of upper surface 105 of lower cladding material 103 is at an angle C within the range of about 8 degrees and about 12 degrees relative to the horizontal upper surface 104 of the lower cladding material 103, and also relative to an upper surface of horizontal portion 106 of waveguide core 107, and also relative to an upper surface 120 of photonic structure 100. The exact angle C is dependent on the design of grating coupler 109 and materials used, as described below.

An upper cladding material 111, formed of for example, an oxide, e.g., silicon dioxide, or of silicon nitride, is provided over and around the sides of waveguide core 107. The upper cladding material 111 has a series of grooves 113 therein over the upwardly sloping portion 108 of the waveguide core 107. The grooves 113 extend into an upper surface of, but not through, the upwardly sloping portion 108 of the waveguide core 107 to form a sloped grating coupler 109. The grating coupler 109 is also sloped by the angle C.

The photonic structure 100 further comprises an oxide material 115, for example, silicon dioxide formed over an upper surface of upper cladding material 111 which extends into grooves 113 to complete, with cladding material 111 and oxide material 103, a surrounding cladding for the waveguide core 107 and sloped grating coupler 109. In one specific example, the slope angle C can be in the range of about 11.5 to about 12 degrees, the depth of the grooves in the upper surface of the sloped portion 108 of the waveguide core 107 may be in the range of about 270 nm to about 280 nm and the period of the grooves may be about 498 nm, although other slope angles C within the range of about 8 degrees to about 12 degrees can be used. Other depths and periods can also be used depending on the design of the grating coupler 109 and materials used.

Light transmitted along the horizontal portion 106 of waveguide 107 (i.e., along optical axis A) passes into the sloped grating coupler 109 which directs the light to exit an upper surface 120 of photonic structure 100 in a direction of optical axis B which is substantially normal to the upper surface 120. Likewise, light entering into the photonic structure 100 at a location over grating 109 in a direction of optical axis B, will be directed by the grating 109 into the horizontal portion 106 of waveguide 107 along axis A. Thus, light enters or leaves the photonic structure 100 at an angle which is substantially normal to upper surface 120, which minimizes optical signal power loss and facilitates assembly with an optical fiber 131 in the manner described below.

One manner in which the FIG. 2 structure can be fabricated is now described with reference to the cross-section views in FIGS. 3A through 3I.

Figure 3A:
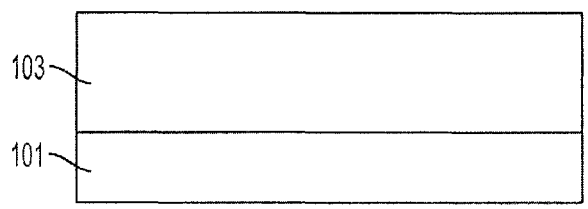
FIGS. 3A-3I illustrate in cross-section one embodiment of a method for forming the FIG. 2 embodiment; and, FIG. 4 illustrates in cross-section the coupling of the FIG. 2 embodiment with an external optical fiber.

FIG. 3A illustrates a substrate 101 having a flat upper surface and which may be of any suitable material for supporting an integrated photonic structure, including semiconductor materials such as silicon. A lower cladding material 103 is provided over substrate 101 and, depending on the material used for waveguide core 107, has an index of refraction lower than that of the waveguide core 107 material. If the waveguide core material is silicon, the lower cladding material 103 may be an oxide, for example, silicon dioxide. The lower cladding material 103 may be deposited by any known deposition technique, for example by PECVD or may be grown if the substrate 101 is a silicon substrate. The thickness of the deposited lower cladding material 103 may be in the range of about 1.5 µm to about 3.0 µm. The upper surface of the lower cladding material may be planarized, e.g., by CMP, to provide a flat surface which is parallel to the flat upper surface of substrate 101 to facilitate further fabrication.

Figure 3B:
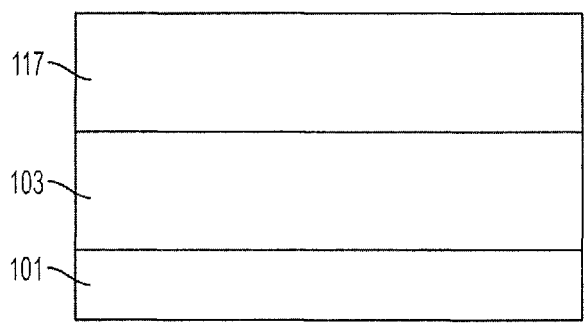
Figure 3C:
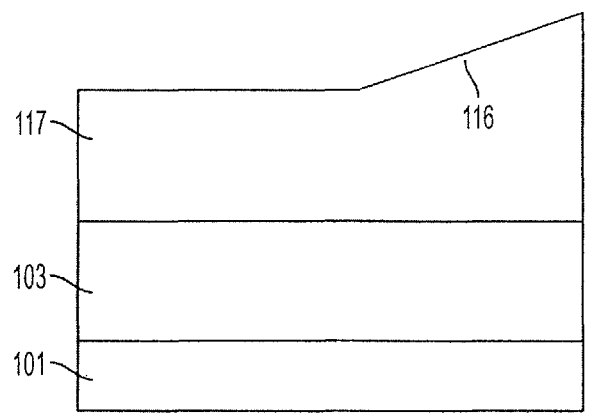
Figure 3D:
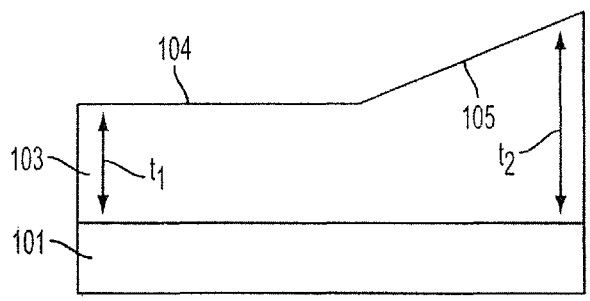

FIG. 3B illustrates the deposition of a photoresist material 117 over the lower cladding material 103. The deposited photoresist material 117 may be planarized, e.g., by CMP, such that the upper surface is flat. The deposited photoresist material 117 is then patterned using a known gray scale lithography technique for example, using high resolution 193 nm laser light and a graduated gray scale mask, to create the sloped upper surface 116 in the resist material 117 shown in FIG. 3C. A reactive ion dry etch (ME), or a deep reactive ion dry etch (DRIE) is performed on the photoresist material 117 illustrated in FIG. 3C which consumes the photoresist material 117 and transfers the pattern of the upper surface of photoresist material 117 into the upper surface of lower cladding material 103, as shown in FIG. 3D. After etching, the lower cladding material 103 has a horizontal upper surface 104 and an upwardly extending sloped upper surface 105. The thickness t1 of the lower cladding material 103 at the horizontal upper surface 104 can be in a range of from about 0.5 um to about 1 um and the thickness t2 of the lower cladding material 103, at the end of the sloped upper surface 105 can be in the range of about 1 um to about 2 um.

Figure 3E:
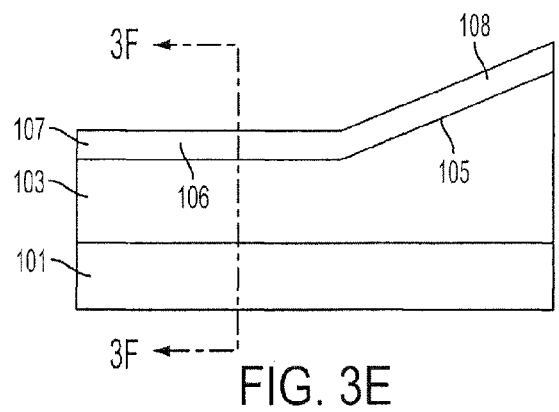
Figure 3F:
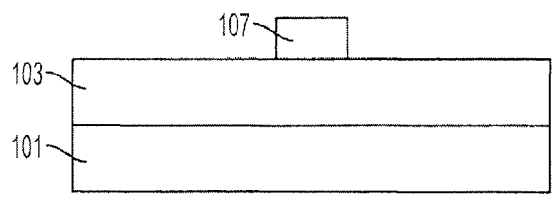

FIG. 3E illustrates deposition of a waveguide core 107 over the upper surface of the lower cladding material 103. Waveguide core 107 may be formed of any suitable material for forming an optical waveguide, including silicon and may have a uniform thickness. Any suitable known deposition technique can be used to form waveguide core 107 including, PEVCD and sputtering, among others. As illustrated in FIG. 3E, the waveguide core 107 has a horizontal portion 106 and an upwardly sloped portion 108 which corresponds to the sloped upper surface 105 of the lower cladding material 103. The waveguide material 107 is initially deposited as a blanket layer which is then masked and etched to the upper surface of the lower cladding material 103 to form waveguide core 107. FIG. 3F shows a ninety degree rotated cross sectional view of the FIG. 3E structure along the lines 3F-3F and the resultant waveguide core 107 after the masking and etching of the waveguide core blanket material.

Figure 3G:
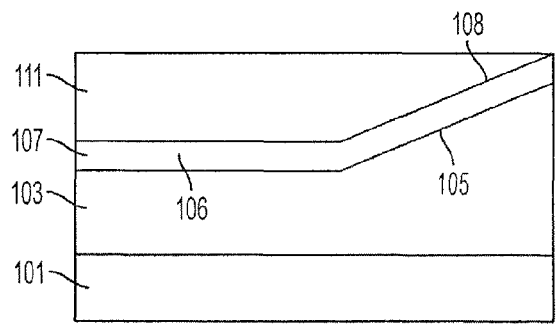

Following formation of waveguide core 107, and as illustrated in FIG. 3G, an upper cladding material 111, which may be an anti-reflective coating, is then deposited over the waveguide core material 107. The deposited upper cladding material 111 is planarized to have a flat surface which is substantially parallel to the flat surface of substrate 101 and the flat upper surface of the horizontal portion 106 of waveguide core 107. Any suitable deposition technique can be used to deposit material 111 including PECVD. The upper cladding material 111 has an index of refraction lower than that of the waveguide core 107 material. For a silicon waveguide core 107 the anti-reflective coating which provides the upper cladding material 111 can be silicon nitride, or an oxide such as silicon dioxide.

Figure 3H:
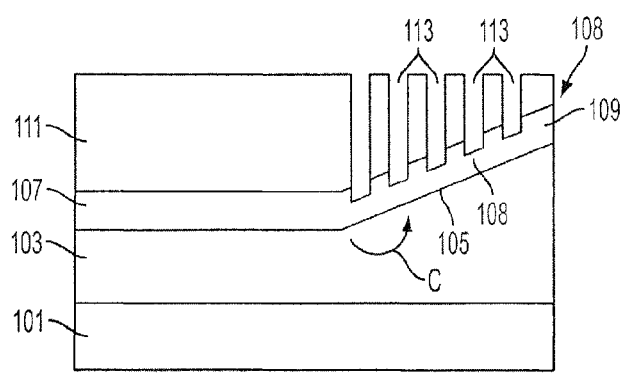

Next, as illustrated in FIG. 3H, the upper cladding material 111 is etched to form a plurality of parallel grooves 113 therein which extend not only through the upper cladding material 111 but also into an upper surface of the sloped portion 108 of the waveguide core 107. The grooves 113 are vertically oriented relative to an upper surface of the horizontal portion 106 of waveguide core 107. The plurality of grooves 113 extend into the upper surface of sloped portion 108 of the waveguide core 107 and form grating coupler 109. The etching of grooves 113 may be performed by reactive ion etching, or other wet or dry etching technique. The bottom of the grooves 113 have a profile which matches the slope profile of the upper surface of sloped portion 108. In one example, the grooves may extend into the upper surface of sloped portion 108 of the waveguide core 107 by an amount in the range of about 270 nm to about 280 nm. The grooves 113 may extend the entire width of the waveguide core 107. In one example, the grooves 113 can also be spaced on a pitch of about 498 nm. However, other groove depths and periods, including non-uniform periods, can be used depending on the desired design of the grating coupler 109, and materials used.

Figure 3I:
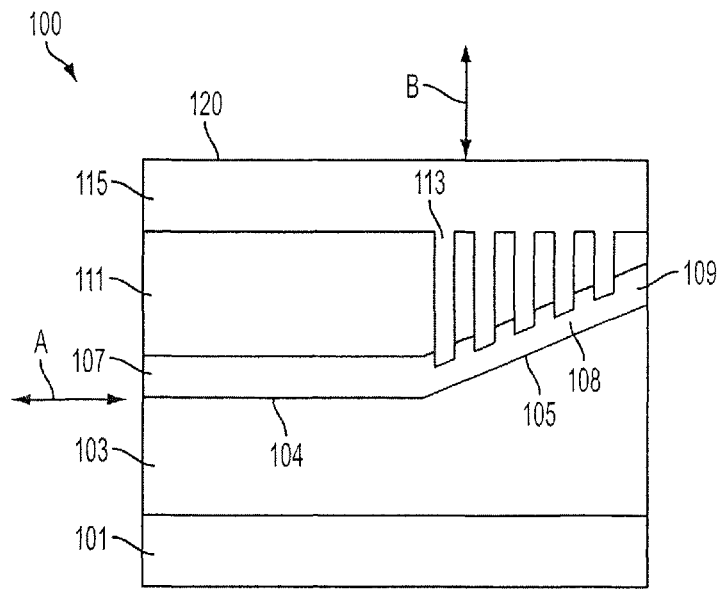

Next, as shown in FIG. 3I, additional cladding material such as an oxide material 115, for example, silicon dioxide, is deposited to overcoat upper cladding material 111 and to fill in the grooves 113. The upper surface 120 of oxide material 115 can be planarized such that it is parallel to the horizontal upper surface of 104 of the lower cladding material 103. By filling in the grooves 113 with the oxide material 115, the upper cladding for waveguide core 107 is complete such that a surrounding cladding for waveguide core 107 and grating coupler 109 is provided by lower cladding material 103, upper cladding material 111, and grooves 113 filled with oxide material 115. As an option, the oxide material 115 can also be planarized to the upper surface of the upper cladding material 111 after grooves 113 are filled in which case the upper surface of the upper cladding material 111 provides the upper surface of the photonic structure 100.

Grating coupler 109 formed on the sloped portion 108 of waveguide core 107 provides a direction change for light passing into or out of waveguide core 107 and into or out of the photonic structure 100 illustrated in FIG. 3I. The angle with which light enters or leaves the photonic structure 100 is at a direction substantially normal to an upper surface 120 of the photonic structure 100. The angle is also substantially normal to materials in the photonic structure 100 including the horizontal portion of waveguide core 107, and the upper surface of upper cladding material 111. As noted, depending on the design of the grating coupler 109 and materials used, the slope angle C for grating 109 is in the range of about 8 degrees to about 12 degrees relative to upper surface 120. Thus, the direction of light into or out of the grating coupler 109 is such that the angle between the direction of light paths A in the horizontal portion 106 of the waveguide core 107 and B into and out of the grating coupler (FIG. 2) is substantially normal, that is, at 90 degrees.

The precise angle C will be different for different physical characteristics of the grating coupler 109, including materials used and location and spacing of the grooves 113, and materials used for the surrounding cladding. Accordingly, the exact slope angle for a particular grating coupler 109 within the range of about 8 degrees to about 12 degrees relative to the upper surface 120 can be determined in advance. One technique for determining the slope angle of a specific grating coupler 109 in advance is to first fabricate a horizontal grating coupler of the same materials and which has the same groove structure as a grating coupler 109 to be fabricated. The exit angle of light propagating through the horizontal grating coupler is measured for deviation from a direction normal to the upper surface of the waveguide core. This deviation angle is then used as the slope angle C in the grating coupler 109 fabricated as described above with reference to FIGS. 3A through 3I. In a second more preferred technique, the construction of the planar waveguide grating coupler is simulated by a computer and the deviation from normal of the light emitted by the simulated planar waveguide is determined and then used to set the slope angle C of the grating coupler 109 fabricated as described with reference to FIGS. 3A through 3I. For the grating coupler 109 having the materials, groove depth and groove pitch as described above, a slope angle of about 11.5 to about 12 degrees has been found suitable to produce an optical direction B of entry or exit of light in the wavelength range of 1525 nm to 1565 nm or 1180 nm to 1260 nm into or from the grating coupler 109, which is substantially normal relative to upper surface 120. In general, the grating period A follows the equation:

$$A = \frac{\lambda o}{n_{eff} - n_{top} \text{Sine} \theta}$$

wherein $n_{eff}$ is the effective refractive index of the waveguide core, $n_{top}$ the refractive index of the cladding, $\lambda o$ is the free space wavelength of light passing through a waveguide, and $\theta$ is the emitting angle of light in a standard non slopped grating coupler. $\theta$ is the angle which is needed for the slope angle C to achieve a substantially normal emission from the sloped grating coupler 109. Any change in etch depth, grating period, the duty cycle and slope, or combination of them, will change $n_{eff}$ and affect the wavelength $\lambda o$ passing through the waveguide.

Figure 4:
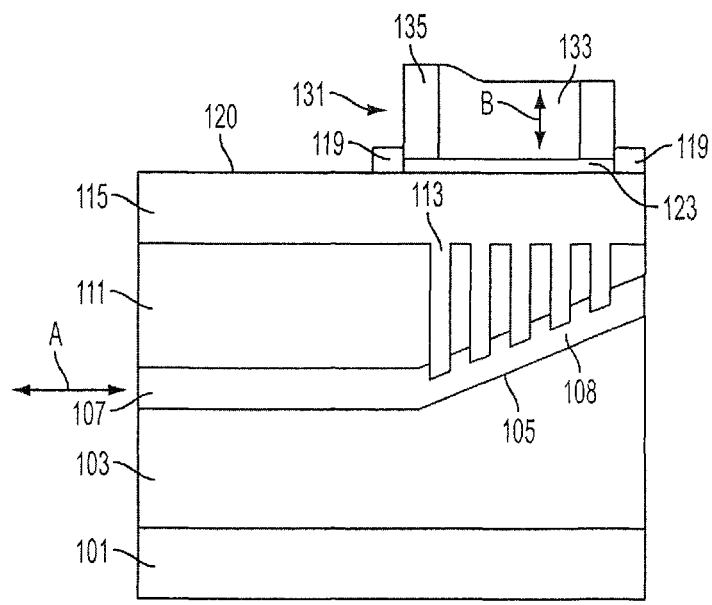

FIG. 4 shows the addition of a fiber alignment structure 119 to the upper surface of oxide material 115. The alignment structure can be fabricated of any suitable material, for example, silicon dioxide and is provided such that an optical fiber 131 held by the alignment structure has an end face which sits squarely over the grating coupler 109. For example, the alignment structure 119 can be fabricated as a collar for surrounding an optical fiber 131. Since the angle of light entering or leaving the integrated circuit structure illustrated in FIG. 4 is substantially normal to the upper surface 120 of the photonic structure 100, the optical fiber 131 can be easily fixed to the photonic structure 100 in a direction substantially normal to upper surface 120 by an optically transparent adhesive 123. Thus, a simplified method for providing a photonic structure 100 which can be easily packaged for connection with an external optical fiber 131 and which does not need an active alignment structure is provided.

The various identified materials can be varied, as can the structure of the grating coupler 109 which is formed, either in the depth of the grooves 113 or period of the grooves in order to accommodate specific wavelengths of light traveling through waveguide 107 and into or out of the photonic structure 100. Also, while waveguide core 107 is described as being formed of silicon, which may be polycrystalline silicon, single crystalline silicon, or amorphous silicon, other materials known to be suitable for forming a waveguide core can also be used. Such other material include silicon nitride ($Si_3N_4$), silicon oxynitride ($SiO_xN_4$), silicon carbide (SiC), silicon germanium ($Si_xGe_y$), gallium arsenide (GaAs), aluminum gallium arsenide (AlGaAs), indium gallium arsenide (InGaAs), indium phosphor (InP), or other light transmission materials. In this list of materials x and y represent a positive integer. Likewise other materials than those discussed above can be used for cladding materials 103, 111, 115, as long as the index of refraction of the material of the waveguide core 107 is higher than that of the surrounding upper and lower cladding materials 103, 111, 115.

While embodiments of an optical grating coupler 109 and method of its formation have been described and illustrated, the invention is not limited by these embodiments. Also, while the photonic structure 100 is shown as having an upper surface 120 of a cladding material 115, it should be apparent that additional light transmissive materials can be formed over the cladding material 115 as part of photonics integrated circuit. Also, as described, cladding material 115 can be planarized down to the upper surface of cladding material 111 such that the upper surface of cladding material 111 provides the upper surface of photonic structure 100. In addition, while the sloped grating coupler 109 is described as being provided in a waveguide core 107, it may also be provided in a light path of other photonic devices.

Accordingly, the invention as described above with reference to specific embodiments is not limited by the foregoing description but is only limited by the scope of the appended claims.

What is claimed as new and desired to be protected by Letters Patent of the United States is:

1. A method of forming a photonic structure, the method comprising:
    forming a lower cladding material over an upper surface of a supporting substrate;
    forming a waveguide core having a horizontal portion and a contiguous sloped portion over the lower cladding material; and
    forming an optical grating in the sloped portion of the waveguide core, the sloped portion and the optical grating configured such that light emitted by the grating is in a direction substantially normal to a surface of the horizontal portion of the waveguide core.

2. A method as in claim 1 wherein the optical grating emits a light wave in a first direction which is substantially normal to the direction of light travel in the horizontal portion.

3. A method as in claim 1 wherein the sloped portion of the waveguide core has a sloped angle relative to the horizontal portion which causes light emitted by the grating to be in a direction substantially normal to an upper surface of the horizontal portion of the waveguide core.

4. A method as in claim 3 wherein forming the optical grating comprises forming a plurality of spaced grooves in an upper surface of the sloped portion of the waveguide core.

5. A method as in claim 4 wherein the plurality of spaced grooves in the upper surface of the waveguide core each have a depth in the range of about 270 nm to about 280 nm.

6. A method as in claim 5, wherein the plurality of spaced grooves have a period of about 498 nm.

7. A method as in claim 6, wherein the waveguide core comprises a material selected from the group consisting of Si, $Si_3N_4$, $SiO_xN_4$, SiC, $Si_xGe_y$, GaAs, AlGaAs, InGaAs, and InP, where x and y are positive integers.

8. A method as in claim 1, further comprising forming an upper cladding material on the sides and over the waveguide core;
    forming grooves in the upper cladding material which extend into the sloped portion of the waveguide core to form the optical grating; and
    filling the grooves with an additional upper cladding material.

9. A method as in claim 8 wherein the additional upper cladding material is also provided over the upper cladding material and provides an upper surface of the photonic structure, wherein light emitted by the optical grating is substantially normal to the upper surface of the additional upper cladding material.

10. A method as in claim 8, wherein the additional upper cladding material is planarized down to the upper surface of the upper cladding material.

11. A method of forming a photonic coupler, the method comprising:
    forming a lower cladding material over an upper surface of a supporting substrate, the lower cladding material having a horizontal portion and a sloped portion coupled to the horizontal portion;
    forming a waveguide core material over the lower cladding material such that the waveguide core material has a horizontal portion and a sloped portion coupled to the horizontal portion; and
    forming a grating coupler in the sloped portion of the waveguide core such that the grating coupler is configured to transmit or receive light passing through the waveguide core.

12. The method of claim 11, further comprising forming an upper cladding material over the waveguide core such that the upper cladding material has a flat upper surface substantially parallel to the horizontal portion of the waveguide core.

13. The method of claim 12 wherein the upper cladding material comprises an anti-reflective coating material.

14. The method of claim 12 wherein forming the grating coupler comprises forming spaced grooves extending through the upper cladding material and into the sloped portion of the waveguide core.

15. The method of claim 14, further comprising forming an additional cladding material within the grooves of the upper cladding material and grooves of the sloped portion of the waveguide core.

16. A photonic structure comprising:
    a substrate;
    a photonic element supported by the substrate and having a horizontal portion and a sloped portion coupled to the horizontal portion; and
    a grating formed at the sloped portion for directing light into or out of the photonic element,
    wherein the direction of light travel out of the grating is substantially normal to the direction of travel of light in the horizontal portion of the photonic element,
    wherein the sloped portion of the waveguide core is in the range of about 8 to about 12 degrees with respect to the horizontal portion of the waveguide core.

17. The photonic structure of claim 16 wherein the photonic element is a waveguide core.

18. The photonic structure of claim 17 wherein the waveguide core is formed of silicon.

19. The photonic structure of claim 17 wherein the material of the waveguide core comprises silicon nitride.

20. The photonic structure of claim 16 wherein the material of the waveguide core comprises silicon oxynitride.

* * * * *